«12» United States Patent  
Murakami et al.

(10) Patent No.: US 8,335,086 B2  
(45) Date of Patent: Dec. 18, 2012

(54) SEMICONDUCTOR MODULE

(75) Inventors: Masahiro Murakami, Osaka (JP); Masahiko Kushino, Osaka (JP); Akiteru Deguchi, Osaka (JP); Yoshihisa Amano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 455 days.

(21) Appl. No.: 12/685,306

(22) Filed: Jan. 11, 2010

(65) Prior Publication Data

US 2010/0202125 A1  Aug. 12, 2010

(30) Foreign Application Priority Data

Feb. 10, 2009 (JP) .................................. 2009-027992

(51) Int. Cl.  
H05K 7/02 (2006.01)  
H05K 7/06 (2006.01)  
H05K 7/08 (2006.01)  
H05K 7/10 (2006.01)

(52) U.S. Cl. ......... 361/783; 361/700; 361/770; 361/790

(58) Field of Classification Search .......... 361/700–710, 361/770, 790, 792  
See application file for complete search history.

(56) References Cited

U.S. PATENT DOCUMENTS 6,131,651 A * 10/2000 Richey, III .................... 165/185  
7,063,127 B2 * 6/2006 Gelorme et al. ............. 165/80.2  
7,200,006 B2 * 4/2007 Farrow et al. ................. 361/704  
7,760,504 B2 * 7/2010 Farrow et al. ................. 361/704  
7,995,344 B2 * 8/2011 Dando, et al. ................ 361/710

FOREIGN PATENT DOCUMENTS

JP  7-42126 U  7/1995

* cited by examiner

Primary Examiner — Tuan T Dinh  
(74) Attorney, Agent, or Firm — Birch, Stewart, Kolasch & Birch, LLP

(57) ABSTRACT

A top panel, which is disposed to face a module board with an electronic component therebetween, includes a resin layer and a metal layer, and has an insulating characteristic. The metal layer includes a metal layer formed at a front side of the resin layer and a metal layer formed at a rear side of the resin layer. With this structure, in reflow soldering performed in mounting a semiconductor module on a main board, warp which is caused, under temperature change, in the top panel due to difference in coefficient of thermal expansion between the resin layer and the metal layer formed at the front side of the resin layer is cancelled by warp which is caused, under temperature change, in the top panel due to difference in coefficient of thermal expansion between the resin layer and the metal layer formed at the rear side of the resin layer, whereby warp of the top panel is eliminated. This helps prevent the electronic component adhered to the top panel with adhesive from being pressed down to or pulled up from the module board due to warp of the top panel.

11 Claims, 6 Drawing Sheets

US 8,335,086 B2

SEMICONDUCTOR MODULE

This nonprovisional application claims priority under 35 U.S.C. §119(a) on Patent Application No. 2009-027992 filed in Japan on Feb. 10, 2009, the entire contents of which are hereby incorporated by reference.

BACKGROUND OF THE INVENTION

1. Field of the Invention

The present invention relates to a semiconductor module having an electronic component placed on a module board, and in particular, to a semiconductor module having a top panel which is disposed to face a module board with an electronic component therebetween to be adhered to the electronic component with adhesive.

2. Description of Related Art

Semiconductor modules having a top panel disposed to face a module board with an electronic component therebetween have conventionally been proposed. For example, JP-U-H07-42126 discloses such a top panel, which is formed with an insulating panel made of a material such as a resin or ceramics (see, for example, paragraph [0010] and FIG. 1 of the above-mentioned publication).

Conventional examples of semiconductor modules having a top panel include one structured such that a legged top panel made of a nickel silver sheet (metal) is soldered to a module board. The top panel needs to be legless to realize a compact module board; however, in a case where a legless top panel is fitted to an electronic component placed on a module board, if the top panel should come off, the top panel (which is made of metal) might come in contact with a component on a main board on which the semiconductor module is mounted, to cause an electrical short circuit.

The above inconvenience caused when the top panel comes off could be prevented by giving the top panel an insulation structure (a structure in which metal is covered with resin). On the other hand, with such a structure, in which the top panel is formed of different materials laid one on top of another, warp occurs in the top panel under temperature change when the semiconductor module is mounted on the main board. This results in mounting failure of the electronic component. This problem will be described below in more detail.

FIG. 5A is a sectional view showing an example of the structure of a semiconductor module having a top panel structured such that metal is insulated with resin. In this semiconductor module, electronic components 103 are placed on a module board 101 with conductor patterns 102 therebetween. The electronic components 103 are adhered (soldered) to the conductor patterns 102 by using solder 104 as necessary. A top panel 105 is disposed to face the module 101 so as to cover the electronic components 103.

The top panel 105 is structured such that a metal layer 105b is adhered to one side of a resin layer 105a, on which a solder resist 105c is further provided so as to coat the metal layer 105b. This structure helps secure stiffness and an insulating characteristic of the top panel 105.

On the other hand, FIG. 6A is a sectional view showing another example of the structure of the semiconductor module having a top panel, structured such that metal is insulated with resin. In this semiconductor module, the metal layer 105b is formed at a side of the resin layer 105a opposite from the side on which the metal layer 105b is formed in the top panel 105 shown in FIG. 5A. That is, the top panel 105 shown in FIG. 6A is structured such that the metal layer 105b is adhered to the resin layer 105a at a side thereof which is closer to the electronic components, and the solder resist 105c is provided as a coating to cover the metal layer 105b.

In either case, the top panel 105 is fixed with adhesive 106 to one of the electronic components 103 that is tall and has a surface large enough to secure an adhesion area. If no electronic component 103 is available in the center portion of the module to be adhered to the top panel 105, the top panel 105 is maintained parallel to the module board 101 by being adhered to a plurality of electronic components 103 placed in the peripheral portion of the module.

However, since the resin layer 105a and the metal layer 105b have different coefficients of thermal expansion, temperature change causes warp in the panel 105 structured such that the metal layer 105b is adhered to just one side of the resin layer 105a as shown in FIGS. 5A and 6A. This results in mounting failure of the electronic components 103 in the module when the semiconductor module is adhered to the main board by reflow soldering.

That is, each of the semiconductor modules shown in FIGS. 5A and 6A is mounted on the unillustrated main board by reflow soldering, and the solder 104 and the adhesive 106 with which the top panel 105 is fixed in the module are melted or softened by heat applied to the semiconductor module on the main board during the reflow soldering. In the structure shown in FIG. 5A, if the top panel 105 warps in a state in which the solder 104 and the adhesive 106 are melted or softened, the top panel 105 presses the electronic components 103 down as shown in FIG. 5B. When cooled, the solder 104 is hardened first, and thus the electronic components 103 are fixed in a tilted state.

On the other hand, in the structure shown in FIG. 6A, if the top panel 105 warps in a state in which the solder 104 and the adhesive 106 are melted or softened, the top panel 105, as shown in FIG. 6B, pulls up the electronic components 103 which are fixed thereto with the adhesive 106. And, when cooled, as in the above described case, the electronic components 105 are fixed in a tilted state.

SUMMARY OF THE INVENTION

The present invention has been made to solve the above problems, and an object of the present invention is to eliminate warp caused to occur, under temperature change, in a top panel formed of different materials, to thereby provide a semiconductor module capable of reducing mounting failure of an electronic component caused when the semiconductor module is placed on a main board.

To achieve the above object, according to the present invention, a semiconductor module is provided with a module board, an electronic component placed on the module board, and a top panel that is disposed to face the module board with the electronic component therebetween and that is adhered to the electronic component with adhesive. Here, the top panel includes a resin layer and a metal layer, and also has an insulating characteristic, said metal layer includes a metal layer formed at a front side of the resin layer and a metal layer formed at a rear side of the resin layer, and warp which is caused to occur in the top panel under temperature change due to difference in coefficient of thermal expansion between the resin layer and the metal layer formed at the front side of the resin layer is cancelled by warp which is caused to occur in the top panel under temperature change due to difference in coefficient of thermal expansion between the resin layer and the metal layer formed at the rear side of the resin layer.

With this structure, since said metal layer of the top panel includes metal layers respectively formed at the front and rear sides of the resin layer, warp which is caused to occur in the top panel under temperature change due to difference in coefficient of thermal expansion between the resin layer and the metal layer formed at the front side of the resin layer can be cancelled by warp which is caused to occur in the top panel under temperature change due to difference in coefficient of thermal expansion between the resin layer and the metal layer formed at the rear side of the resin layer. As a result, warp occurring in the top panel under temperature change can be eliminated from all over the top panel. Thus, for example, in a reflow soldering process performed in mounting the semiconductor module on a main board, the electronic component in the module adhered to the top panel with the adhesive can be prevented from pressed down to the module board, or inversely, pulled up due to warp of the top panel. This helps reduce mounting failure of the electronic component on the module board.

BRIEF DESCRIPTION OF THE DRAWINGS

These and other objects and features of the present invention will be understood more clearly from the following descriptions of preferred embodiments and accompanying drawings that are briefly summarized below.

DETAILED DESCRIPTION OF PREFERRED EMBODIMENTS

Embodiment 1

Hereinafter, an embodiment of the present invention will be described with reference to the relevant drawings.

Figure 1A:
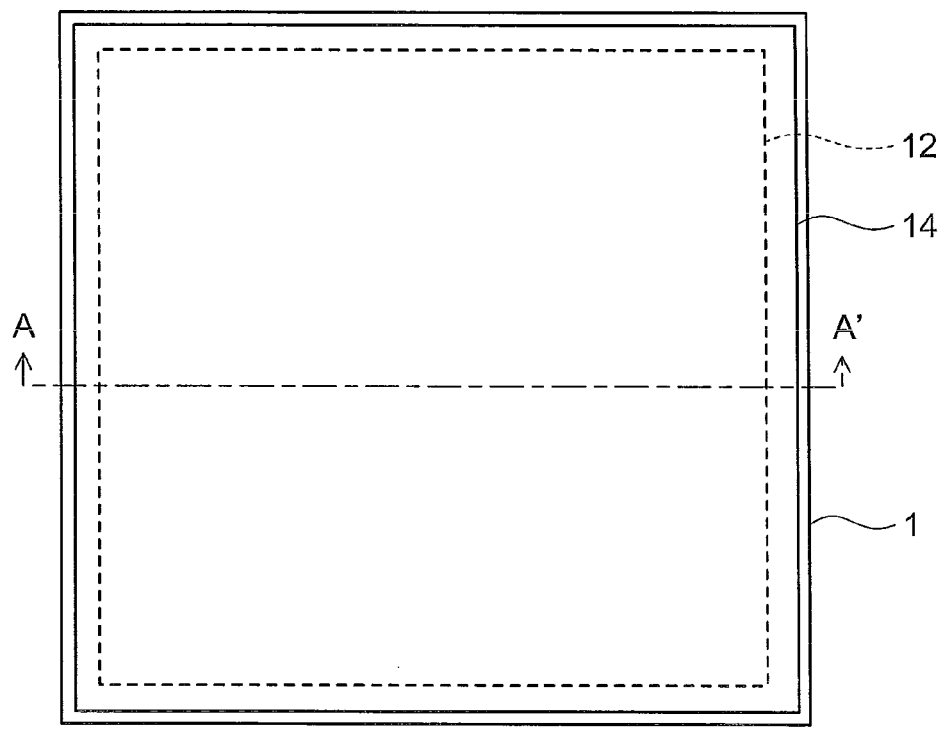
FIG. 1A is a plan view schematically showing the structure of a semiconductor module according to an embodiment of the present invention.
Figure 1B:
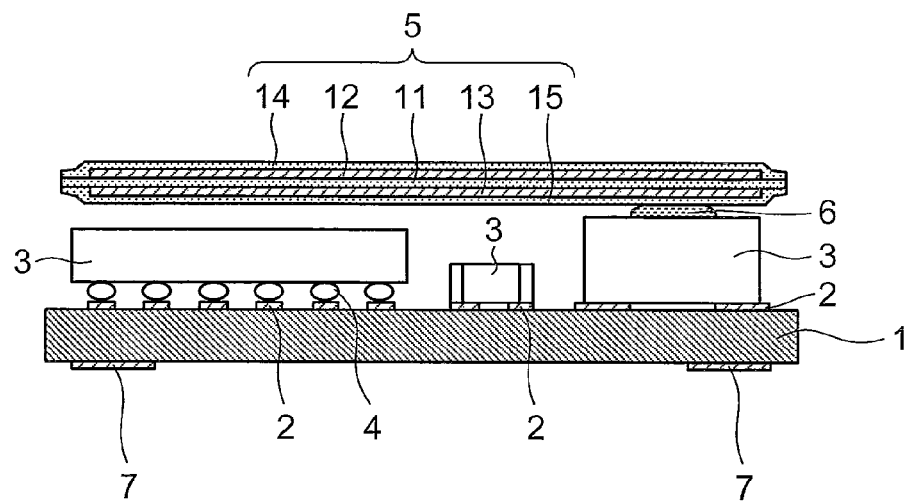
FIG. 1B is a sectional view showing the semiconductor module.

FIG. 1A is a plan view schematically showing the structure of a semiconductor module according to this embodiment, and FIG. 1B is a sectional view taken along line A-A' of FIG. 1A. In the semiconductor module of this embodiment, an electronic component 3 is placed on a conductor pattern 2 on a module board 1 (a wiring board). As the electronic component 3, there are provided a plurality of electronic components 3 including passive components such as an inductor, a condenser and a resistor, and active components such as an IC and a semiconductor. The plurality of electronic components 3 are adhered (soldered) to the conductor pattern 2 with solder 4 as necessary. A top panel 5 is disposed so as to face the module board 1 with the electronic components 3 therebetween. The top panel 5 is adhered, with an adhesive 6 (an elastic material), to a top surface of one electronic component 3 of the plurality of electronic components 3.

On a rear side of the module board 1, that is, on a side of the module board 1 that is opposite from the side thereof on which the electronic components are placed, a conductor pattern 7 is formed to be connected to an unillustrated main board (a circuit board) via an external connection electrode. The above-structured semiconductor module is mounted on the main board by reflow soldering.

Next, a description will be given of the structure of the above-mentioned top panel 5. The top panel 5 is formed with a resin layer 11, metal layers 12 and 13, and solder resists 14 and 15 that function as insulating layers. The metal layer 12 (a first metal layer) is formed at a front side of the resin layer 11 except the peripheral portion thereof. The solder resist 14 is provided on the resin layer 11 as a coating so as to cover the metal layer 12. On the other hand, the metal layer 13 (a second metal layer) is formed at a rear side of the resin layer 11 except the peripheral portion thereof. The solder resist 15 is provided on the resin layer 11 as a coating so as to cover the metal layer 13. As a result, the top panel 5 has a layer structure whose front and rear sides are symmetric to each other with respect to the resin layer 11.

Here, the front side of the resin layer 11 is a side of the resin layer 11 opposite from a side thereof that faces the module board 1 (that is, the side adhered to the electronic component 3 with the adhesive 6). The rear side of the resin layer 11 is the side of the resin layer 11 that faces the module board 1. Thus, for example, the metal layer at the front side of the resin layer 11 is the metal layer 12, and the metal layer at the rear side of the resin layer 11 is the metal layer 13.

According to the layer structure of the top panel 5 as described above, the metal layers 12 and 13 are covered with resin (the resin layer 11 and the solder resists 14 and 15), and this helps secure the insulating characteristic of the top panel 5. This helps prevent an electric short circuit from occurring when the top panel 5 comes off to come in contact with the main board. Furthermore, the metal layers 12 and 13 provided in the top panel 5 helps secure stiffness of the top panel 5.

Here, the resin layer 11 is formed of a nonconductive organic material having thermal resistance sufficient to resists heat in the reflow soldering process. Specifically, since the peak temperature in the reflow soldering process is approximately 240 to 250° C., and the resin layer 11 at least needs to be formed with a material having sufficient thermal resistance to withstand the temperature, the resin layer 11 in this embodiment is formed with a glass-epoxy material approximately 0.1 mm thick. The coefficient of thermal expansion of the glass-epoxy material is $10 \times 10^{-6}$ to $20 \times 10^{-6}/°$ C. at temperatures below the glass transition point, and at temperatures above the glass transition point (140 to 180° C.), the coefficient of thermal expansion of the glass-epoxy material can be assumed to be greater than that at temperatures below the glass transition point by an order of magnitude. Thus, forming the resin layer 11 with the material described above makes it possible to surely realize a semiconductor module that can be mounted on a main board by reflow soldering.

The metal layers 12 and 13 are formed with a same metal material to have a same thickness; in this embodiment, they are each formed with a copper foil (for example, several tens of μm thick) that is thinner than the resin layer 11. The copper foil has a coefficient of thermal expansion of $16.5 \times 10^{-6}/°$ C. (20° C.). Incidentally, under a temperature corresponding to the temperature inside a reflow furnace, the copper foil has a coefficient of thermal expansion of $18.3 \times 10^{-6}/°C$ ($227°C$), which is not much different from that at the temperature of $20°C$.

Since the metal layers 12 and 13 formed with a same material to have the same thickness are formed at the front and rear sides, respectively, of the resin layer 11, in the reflow soldering process performed to mount the semiconductor module on the main board, the front and rear sides of the top panel are symmetrical to each other in thermal behavior. That is, warp caused to occur in the top panel 5 under temperature change due to the difference in coefficient of thermal expansion between the resin layer 11 and the metal layer 12 is cancelled by warp caused to occur in the top panel 5 under temperature change due to the difference in coefficient of thermal expansion between the resin layer 11 and the metal layer 13. As a result, warp caused to occur in the top panel 5 under temperature change is eliminated. Hence, in the reflow soldering process, the electronic component 3 in the module adhered to the top panel 5 with the adhesive 6 can be prevented from being pressed down to the module board 1, or inversely, pulled up, due to warp of the top panel 5. This leads to reduced mounting failure of the electronic components 3 with respect to the module board 1. That is, even if the top panel 5 includes different materials of resin and metal, it is possible, in the reflow soldering process, to prevent warp from being caused to occur in the top panel 5 due to the difference in coefficient of thermal expansion. As a result, mounting failure of the electronic components 3 can be reduced.

Note that the metal layers 12 and 13 are not necessarily limited to be formed with a same material to have a same thickness. That is, the metal layers 12 and 13 may be formed with different materials. Here, the front and rear sides of the top panel 5 can be made symmetrical to each other in thermal behavior by adjusting the thicknesses of the metal layers 12 and 13. In this case, a metal material to be used in the top panel 5 can be selected from a larger variety of metal materials. That is, combination of materials for the metal layers 12 and 13 can be selected more freely.

In summary of the above descriptions, the following can be said: the semiconductor module of this embodiment has the metal layers 12 and 13 formed at the front and rear sides, respectively, of the resin layer 11; and the semiconductor module of this embodiment is structured such that, whether the metal layers 12 and 13 are formed with a same material or not, warp that is caused to occur in the top panel 5 under temperature change due to the difference in coefficient of thermal expansion between the resin layer 11 and the metal layer 12 is cancelled by warp that is caused to occur in the top panel 5 under temperature change due to the difference in coefficient of thermal expansion between the resin layer 11 and the metal layer 13.

In particular, if the metal layers 12 and 13 formed at the front and rear sides, respectively, of the resin layer 11 are formed with a same material to have a same thickness, warp can be securely and easily eliminated from the top panel 5 in the reflow soldering process. As a result, mounting failure of the electrical components 3 occurring during the reflow soldering can be securely and easily reduced.

Furthermore, according to this embodiment, the top panel 5 is adhered to one of the electronic components 3 with the adhesive 6 at one adhesion point. Thus, even if the top panel warps upward from the adhesion point so as to be convex toward the inside of the module, since the top panel 5 is not adhered to the other electronic components 3, the other electronic components 3 are not pulled up by the warping top panel 5. This helps securely prevent mounting failure of the other electronic components 3.

Embodiment 2

Hereinafter, another embodiment of the present invention will be described with reference to the relevant drawings. For the sake of convenience of description, such parts as find their counterparts in Embodiment 1 are identified by common reference numerals, and overlapping description thereof will be omitted.

Figure 2A:
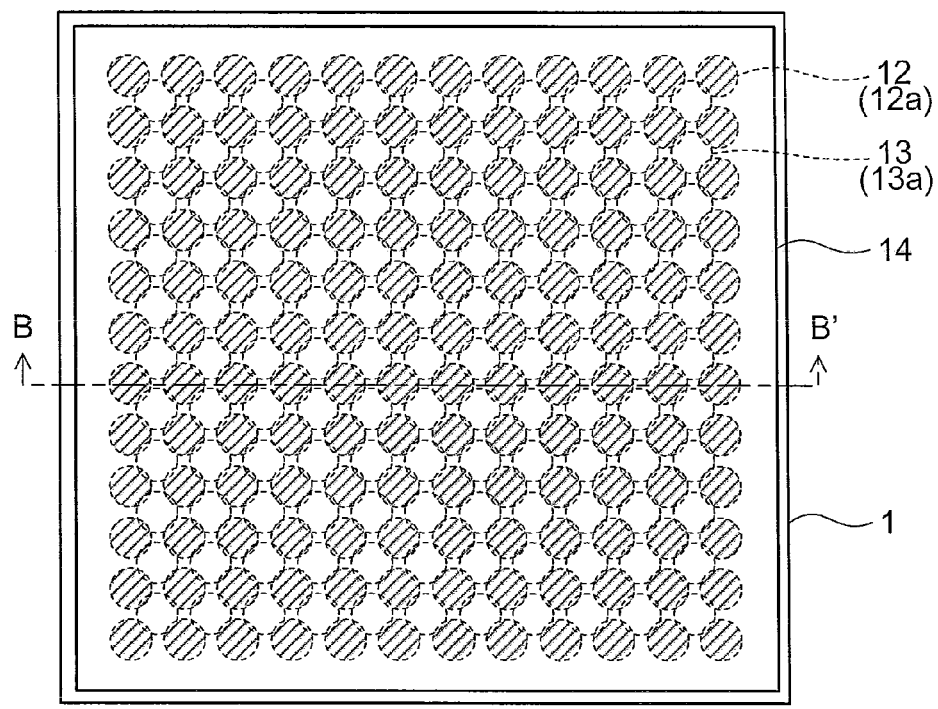
FIG. 2A is a plan view schematically showing the structure of a semiconductor module according to another embodiment of the present invention.
Figure 2B:
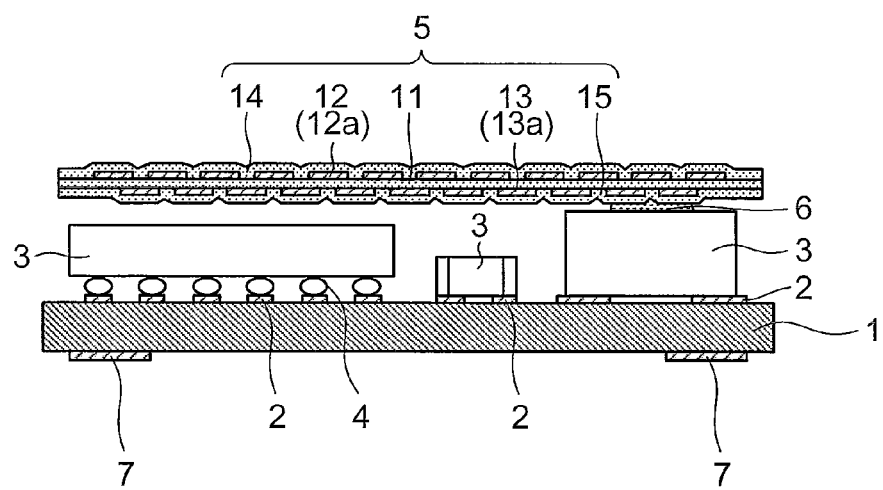
FIG. 2B is a sectional view showing the semiconductor module.

FIG. 2A is a plan view schematically showing the structure of a semiconductor module according to this embodiment, and FIG. 2B is a sectional view taken along line B-B' of FIG. 2A. In the semiconductor module of this embodiment, a metal layer 12 at a front side of a resin layer 11 is divided into a plurality of metal parts 12a uniformly arranged in a regular pattern. The metal parts 12a are each formed, for example, in the shape of a circle whose diameter is 0.3 mm, and arranged at pitches of 0.4 mm in two directions (up-down and right-left directions in the figure) perpendicular to each other.

In the same manner as in the just-described metal layer 12, a metal layer 13 at a rear side of the resin layer 11 is also divided into a plurality of metal parts 13a uniformly arranged in a regular pattern. The metal parts 13a are each formed, for example, in the shape of a circle whose diameter is 0.3 mm, and arranged at pitches of 0.4 mm in two directions (up-down and right-left directions in the figure) perpendicular to each other. However, each metal part 13a is displaced from each metal part 12a. More specifically, each metal part 13a is formed to be displaced with respect to each adjacent metal part 12a in both the up-down and right-left directions in the figure by half pitch (for example, 0.2 mm).

In the structure in which, as in this embodiment, the metal layers 12 and 13 are formed of a plurality of metal parts 12a and 13a, respectively, which are arranged in regular patterns, the total area occupied by the metal layers 12 and 13 is reduced, for example, to half, and the differences in thermal expansion (thermal stress) between the resin layer 11 and the each of the metal layers 12 and 13 are accordingly reduced as compared with in the structure in which, as in the embodiment 1, the metal layers 12 and 13 are each formed as a one-piece layer with respect to the resin layer 11. However, even with this structure, warp occurring in the top panel 5 under temperature change due to the difference in coefficient of thermal expansion between the resin layer 11 and the metal layer 12 can be canceled by warp occurring in the top panel 5 under temperature change due to the difference in coefficient of thermal expansion between the resin layer 11 and the metal layer 13, and thus, it is possible to eliminate warp occurring in the top panel 5 under temperature change. Thus, with this structure, the above-described effects can be advantageously obtained with a reduced total area of metal layers 12 and 13.

Furthermore, in this embodiment, since the metal parts 12a and 13a are arranged at the same pitches in the metal layers 12 and 13, respectively, formed at the front and rear sides, respectively, of the resin layer 11, the effect of preventing warp of the top panel 5 derived from the metal parts 12a and 13a (metal layers 12 and 13) can be uniformly exerted all over the top panel 5.

Moreover, in this embodiment, the metal layers 12 and 13 are disposed such that each metal part 12a is displaced with respect to each adjacent metal part 13a in two arrangement directions perpendicular to each other (that is, up-down and right-left directions in the figure). As a result, as shown in FIG. 2A, each metal part 13a can be located at a position in the metal layer 13 corresponding to a position in the metal layer 12 surrounded by four metal parts 12a. Likewise, each metal part 12a can be located at a position in the metal layer 12 corresponding to a position in the metal layer 13 surrounded by four metal parts 13a. This results in a state in which the resin layer 11 has a metal part existing either at the front or rear side of every part thereof (or a state close to this state), and this helps secure uniform stiffness all over the top panel 5.

Moreover, the metal parts 12a and 13a are uniformly arranged at the front and rear sides, respectively, of the resin layer 11 in regular patterns, such that the sums of areas at the front and rear sides of the resin layer occupied by the metal parts 12a and 13a, respectively, are equal. This structure, in which the amount of area at the front side of the resin layer 11 occupied by the metal parts 12a is equal to the amount of area at the rear side of the resin layer 11 occupied by the metal parts 13a, allows the difference in thermal expansion under temperature change between the resin layer 11 and the metal layer 12 to be equal to the difference in thermal expansion under temperature change between the resin layer 11 and the metal layer 13. This helps securely eliminate warp of the top panel 5 under temperature change.

Moreover, in this embodiment, the metal parts 13a, which are circular, are arranged independently of one another at the rear side of the resin layer 11, that is, the side to which the electronic component 3 is adhered, so that the metal parts 13 exist at some parts of the rear side of the resin layer 11 but do not at the other parts. As a result, as shown in FIG. 2B, a solder resist 15 formed on the resin layer 11 so as to cover the metal parts 13a has an uneven surface having alternately-occurring convex and concave portions. This means that the surface of the top panel 5 that is in contact with the adhesive 6 is an uneven surface having alternately-occurring convex and concave portions. This helps make the top panel 5 and the adhesive 6 contact each other over a wider area in comparison with a case in which the contact surface between the top panel 5 and the adhesive 6 is an even (or a plane) surface as in the embodiment 1. As a result, the adhesive strength can be improved. The thus increased adhesive strength allows the top panel 5 to be adhered to an electronic component 3 disposed at the periphery of the module instead of one disposed at the center of the module, and this leads to a larger variety of ways of adhering the top panel 5.

In this embodiment, the metal parts 12a and 13a are circular, but instead, they may have another shape such as a square shape. Also, the size of the metal parts 12a and 13a and their arrangement pitches are not limited to the values mentioned above.

Embodiment 3

Hereinafter, still another embodiment of the present invention will be described with reference to the relevant drawings. For the sake of convenience of description, such parts as find their counterparts in Embodiments 1 and 2 are identified by common reference numerals, and overlapping description thereof will be omitted.

Figure 3A:
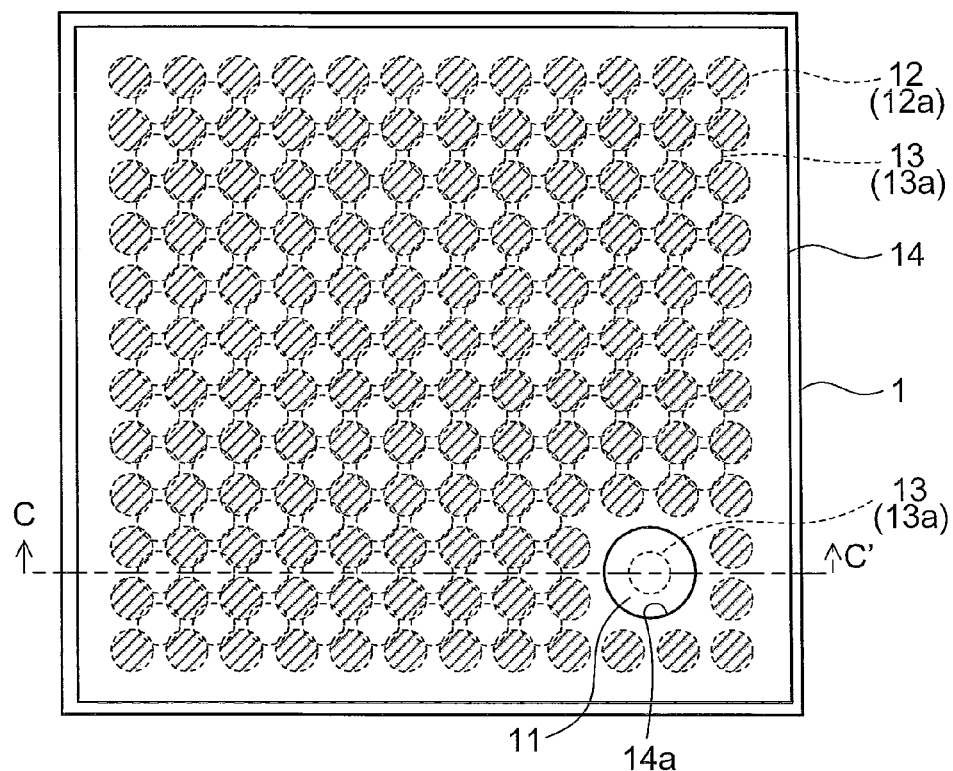
FIG. 3A is a plan view schematically showing the structure of a semiconductor module according to still another embodiment of the present invention.
Figure 3B:
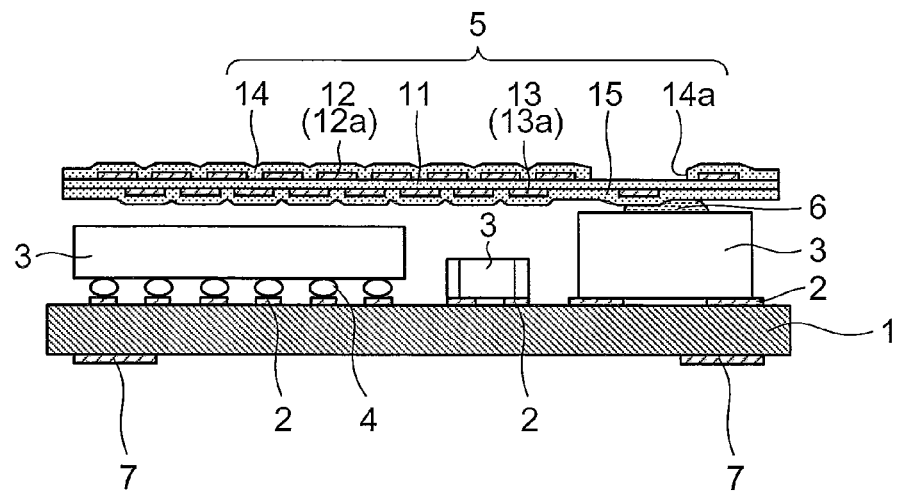
FIG. 3B is a sectional view showing the semiconductor module.

FIG. 3A is a plan view schematically showing the structure of a semiconductor module according to this embodiment, and FIG. 3B is a sectional view taken along line C-C' of FIG. 3A. The semiconductor module of this embodiment is different from that of Embodiment 2 in that a metal layer 12 at the front side of a resin layer 11 and a solder resist 14 formed to cover the metal layer 12 are formed except an area of the front side of the resin layer corresponding to part of a metal layer 13 (part of metal parts 13a) formed at the rear side of the resin layer 11. That is, at the front side of the resin layer 11, no metal layer 12 (metal part 12a) exists in an area corresponding to part of the metal layer 13 formed at the rear side of the resin layer 11. And, in the solder resist 14, a hole 14a is formed to correspond to the above-mentioned area. As a result, part of the front side of the resin layer 11 is exposed via the hole 14a.

In a case in which the resin layer 11 is formed of a transparent or translucent resin such as a glass-epoxy material as described above, part of the metal layer 13 (metal parts 13a) at the rear side of the resin layer 11 can be seen from the front side through the hole 14a and the resin layer 11, and this see-through area can be used as an alternative for marking. Typically, a mark indicating a first pin of a module is marked on the top panel by laser marking or the like. In contrast, the structure of this embodiment in which the see-through area can be used instead of marking helps save time and trouble of performing laser marking. As a result the production efficiency of the module can be improved.

Embodiment 4

Hereinafter, still another embodiment of the present invention will be described with reference to the relevant drawings. For the sake of convenience of description, such parts as find their counterparts in Embodiments 1, 2 and 3 are identified by common reference numerals, and overlapping description thereof will be omitted.

Figure 4A:
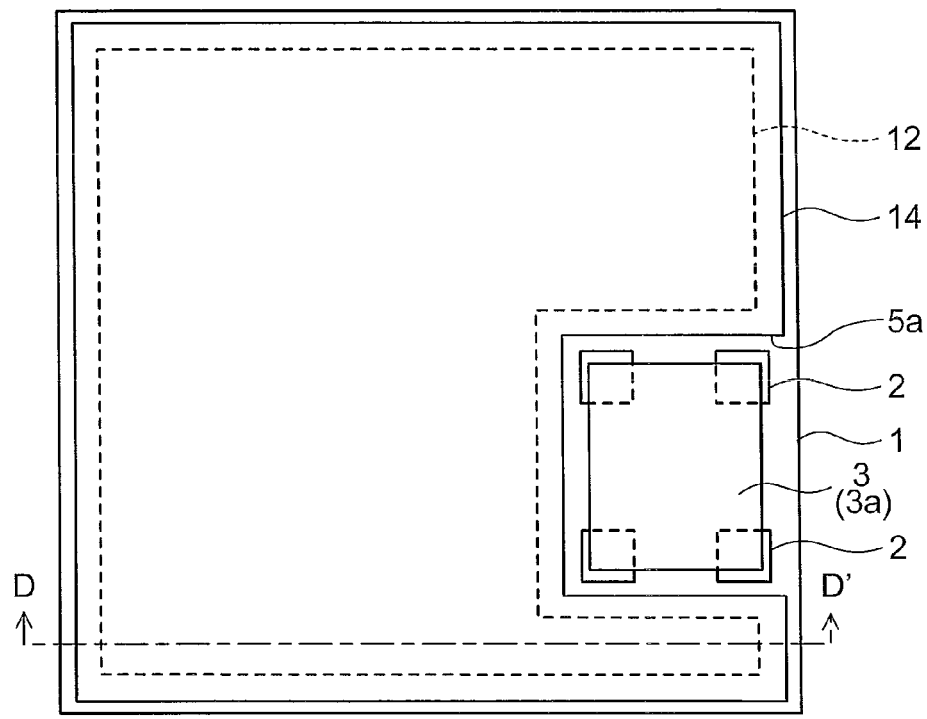
FIG. 4A is a plan view schematically showing the structure of a semiconductor module according to still another embodiment of the present invention.
Figure 4B:
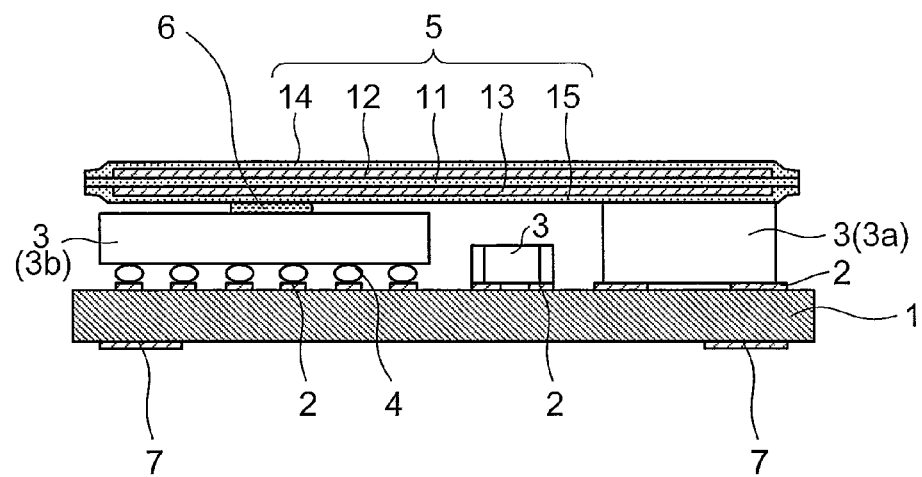
FIG. 4B is a sectional view showing the semiconductor module.
Figure 5A:
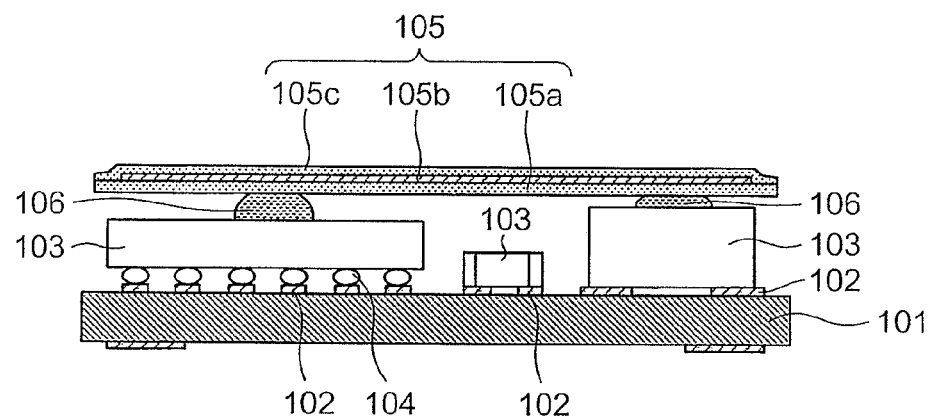
FIG. 5A is a sectional view showing an example of the structure of a semiconductor module having a top panel made by insulating metal with resin.
Figure 5B:
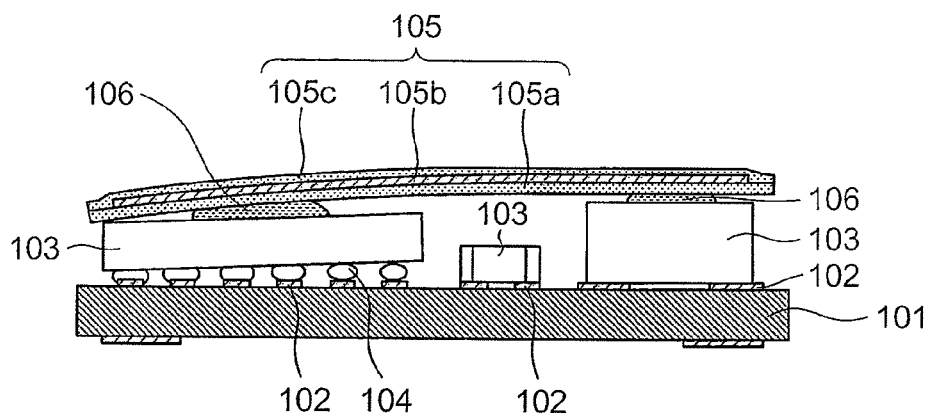
FIG. 5B is a sectional view of the semiconductor module showing a state in which warp has occurred in the top panel.
Figure 6A:
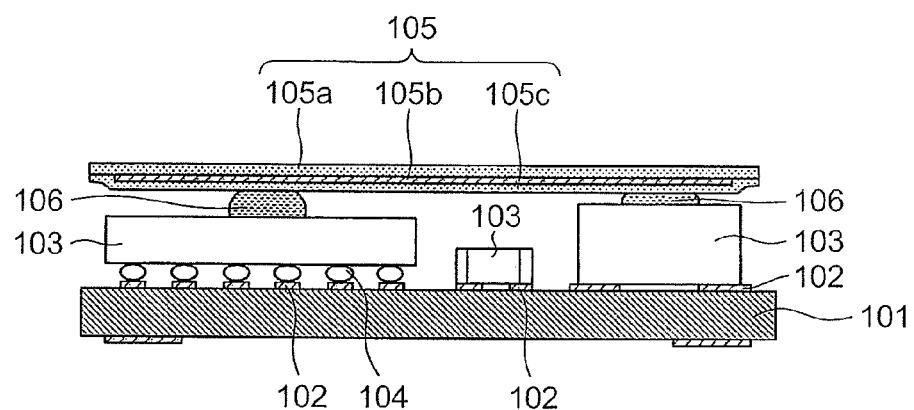
FIG. 6A is a sectional view showing another example of the structure of a semiconductor module having a top panel made by insulating metal with resin.
Figure 6B:
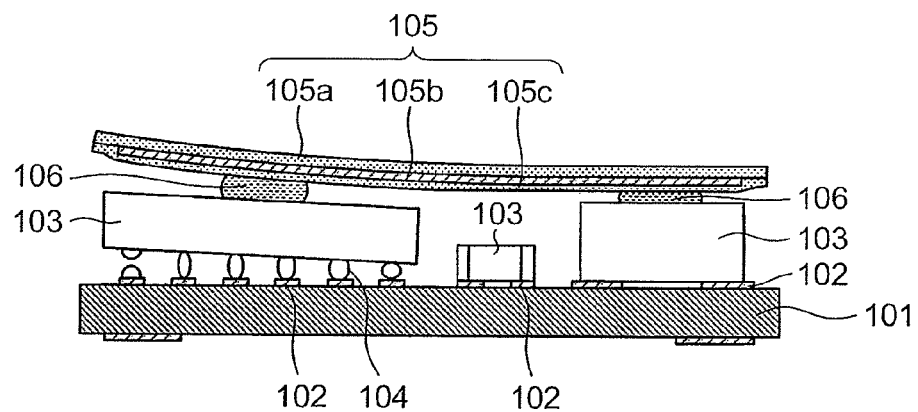
FIG. 6B is a sectional view of the semiconductor module showing a state in which warp has occurred in the top panel.

FIG. 4A is a plan view schematically showing the structure of a semiconductor module according to this embodiment, and FIG. 4B is a sectional view taken along line D-D' of FIG. 4A. The semiconductor module of this embodiment is different from the semiconductor module of Embodiment 1 in that the top panel 5 has an opening 5a. The opening 5a is formed to penetrate through, or formed by cutting off, part of each of a resin layer 11 and solder resists 14 and 15. Metal layers 12 and 13 are formed at front and rear sides of the resin layer 11 except the peripheral portion of the resin layer 11. The opening 5a may be formed as a hole with a closed periphery, or may be formed in the shape of a cutout where part of its periphery is open as shown in FIG. 4A.

According to this embodiment, part (for example, a tallest electronic component 3a) of a plurality of electronic components 3 which are placed on a module board 1 is fitted to the opening 5a, which is so sized and shaped as to be able to accept the part of the plurality of electronic components 3. Thus, the semiconductor module is composed by fitting the tallest electronic component 3a to the opening 5a and adhering an electronic component 3b among the other electronic components 3 to the top panel 5 with adhesive 6. The tallest electronic component 3a is an electronic component whose top surface at the top plate 5 side is located farther away from the module board 1 than that of any other one of the plurality of electronic components 3.

Thus, in the case in which the plurality of electronic components 3 including the tall electronic component 3a have different heights, the module itself can be made small in height in spite of the tall electronic component 3a by fitting the tall electronic component 3a to the opening 5a formed in the top panel 5 and adhering the electronic component 3b among the other electronic components 3 to the top panel 5 with the adhesive 6. As a result, a compact module can be realized even with the tall electronic component 3a.

Note that the number of the opening 5a formed in the top panel 5 is not limited to one. For example, in a case in which a number "n" of electronic components 3 are placed on the module board 1, up to a number "n–1" of openings 5a may be formed in the top panel 5 into which the number "n–1" of electronic components 3 are fitted and the remaining one of the electronic components 3 may be adhered to the top panel 5 with the adhesive 6.

According to the structures of the embodiments hitherto described, a semiconductor module with a top panel 5 adhered thereto can obtain the following advantages: (1) the stiffness of the top panel 5 can be secured; (2) warp is unlikely to occur in the top panel 5 when reflow soldering is performed; (3) the thermal expansion of the top panel 5 is unlikely to adversely affect the mounting of the electronic components 3; and (4) the adhesion strength of the top panel 5can be maintained.

It goes without saying that a semiconductor module can be formed by appropriately combining the above-described embodiments. For example, a semiconductor module can be formed by combining the structure of Embodiment 4 in which the opening 5a is provided in the top panel 5 and the structures of Embodiments 2 and 3 in which the metal layers 12 and 13 are formed in division patterns.

Furthermore, the present invention can be applied to a semiconductor module that is reflow-soldered to a main board.

The semiconductor module of the present invention described in the above embodiments can also be described as below, and as a result, it can be said to provide the following operations and effects.

According to the present invention, a semiconductor module is provided with a top panel that is disposed to face a module board with an electronic component that is placed on the module substrate therebetween and that is adhered to the electronic component with adhesive. The semiconductor module is structured such that the top panel includes a resin layer and a metal layer, and also has an insulating characteristic, such that the metal layer includes a metal layer formed at the front side of the resin layer and a metal layer formed at the rear side of the resin layer, and such that warp which is caused, under temperature change, in the top panel due to difference in coefficient of thermal expansion between the resin layer and the metal layer formed at the front side of the resin layer is cancelled by warp which is caused in the top panel due to difference in coefficient of thermal expansion between the resin layer and the metal layer formed at the rear side of the resin layer.

According to the above structure, the top panel which is arranged to face the module board (wiring board) is adhered with the adhesive to the electronic component placed on the module board. The insulating characteristic of the top panel helps avoid an electric short circuit even when the top panel comes off and comes in contact with a main board (circuit board) on which the semiconductor module is mounted.

Furthermore, the top panel includes the resin layer and the metal layers, which are formed of different materials, and the metal layers are formed one at each of the front and rear sides of the resin layer, so that warp which is caused to occur in the top panel under temperature change due to difference in coefficient of thermal expansion between the resin layer and the metal layer (also referred to as a first metal layer) formed at the front side of the resin layer is cancelled by warp which is caused to occur in the top panel under temperature change due to difference in coefficient of thermal expansion between the resin layer and the metal layer (also referred to as a second metal layer) formed at the rear side of the resin layer. This makes the behavior of the top panel under temperature change symmetrical between the front and rear sides of the resin layer, and as a result, warp occurring in the top panel under temperature change can be eliminated from all over the top panel. Thus, for example, in a reflow soldering process performed in mounting the semiconductor module on the main board, the electronic component in the module adhered to the top panel with the adhesive can be prevented from being pressed down to the module board, or inversely, pulled up due to warp of the top panel. This helps reduce mounting failure of the electronic component with respect to the module board.

In the semiconductor module of the present invention, the metal layers formed one at each of the front and rear sides of the resin layer may be formed of a same material to have a same thickness. In this case, since warp occurring in the top panel under temperature change can be securely and easily eliminated from all over the top panel, mounting failure of the electronic component can be securely and easily reduced.

In the semiconductor module of the present invention, the metal layers formed one at each of the front and rear sides of the resin layer may each be divided into a plurality of metal parts arranged in a regular pattern. In this case, in comparison with a case in which the metal layers are each formed as a one-piece layer with respect to the resin layer, differences in thermal expansion between the resin layer and each of the metal layers are advantageously reduced. That is, the above advantages offered by the invention can be obtained with a smaller amount of metal layers.

In the semiconductor module of the present invention, it is preferable that the metal parts be arranged at equal pitches in the metal layers formed at the front and rear sides of the resin layer. In this case, the effect of preventing warp of the top panel derived from the metal parts can be uniformly exerted over the entire top panel.

In the semiconductor module of the present invention, it is preferable that each one of the metal parts of the metal layer at the front side of the resin layer be displaced with respect to each one of the metal parts of the metal layer at the rear side of the resin layer in both of two arrangement directions which are perpendicular to each other. With this structure, for example, for a position in one metal layer (a first metal layer) surrounded by four metal parts, a metal part is formed at the corresponding position in the other metal layer (a second metal layer). This helps secure uniform stiffness over the entire top panel.

In the semiconductor module of the present invention, it is preferable that a sum of areas occupied by the metal parts in the front side of the resin layer be equal to a sum of areas occupied by the metal parts in the rear side of the resin layer. In this case, since the differences in thermal expansion under temperature change between the resin layer and the first metal layer and between the resin layer and the second metal layer can be made equal, warp occurring in the top panel under temperature change can be securely eliminated.

In the semiconductor module of the present invention, the resin layer may be formed of a transparent or translucent resin, the top panel may further include insulating layers formed on the resin layer so as to cover the metal layers, and the metal layer at the front side of the resin layer and the insulating layer covering the metal layer may be formed except an area of the front side of the resin layer corresponding to part of the metal layer at the rear side of the resin layer.

With this structure, part of the metal layer (metal parts) at the rear side of the resin layer can be seen from the front side through the transparent or translucent resin layer, and this see-through area can be used instead of marking. This helps save time and trouble of performing laser marking, and thus the production efficiency of the module can be improved. Furthermore, the provision of the insulating layers covering the metal layers on the resin layer surely helps secure the insulating characteristic of the top panel.

In the semiconductor module of the present invention, it is preferable that the top panel be adhered with the adhesive to one of the electronic components placed on the module board. With this structure, since the top panel is adhered to the one electronic component at one adhesion point, even when the top panel warps from the adhesion point due to some cause, the other electronic components will not be pulled up by the warping top panel. Thus, mounting failure of the electronic components can securely be prevented.

In the semiconductor module of the present invention, it is preferable that a surface of the top panel that is in contact with the adhesive be an uneven surface with alternately-occurring convex and concave portions. This helps make the top panel and the adhesive contact with each other over a wider area in comparison with a case in which the contact surface between the top panel and the adhesive is an even (or a plane) surface. As a result, the adhesive strength can be improved. The thus increased adhesive strength allows the top panel to be adhered to an electronic component disposed at the periphery of the module instead of one disposed at the center of the module, and this leads to a larger variety of ways of adhering the top panel.

In the semiconductor module of the present invention, the top panel may have at least one opening into which one of a plurality of electronic components placed on the module board is fitted. In a case in which the plurality of electronic components have different heights, the module itself can be made small in height, despite using a tall electronic component, by fitting the tall electronic component to the opening formed in the top panel and adhering the other electronic components to the top panel with the adhesive. As a result, a compact module can be realized even with a tall electronic component.

In the semiconductor module of the present invention, it is preferable that the resin layer of the top panel be formed of an organic material having thermal resistance sufficient to withstand heat from the reflow soldering process. In this case, it is possible to securely realize a semiconductor module that can be mounted on a main board by reflow soldering.

From the foregoing descriptions, it is clear that the present invention may be modified or changed in various forms. Therefore, it should be understood that the present invention can be carried out within the scope of the attached claims without being restricted by the specific descriptions.

What is claimed is:

1. A semiconductor module, comprising:
a module board;
an electronic component placed on the module board; and
a top panel that is disposed to face the module board with the electronic component therebetween, and that is adhered to the electronic component with adhesive,
wherein the top plate includes a resin layer and a metal layer, and also has an insulating characteristic,
wherein said metal layer includes a metal layer formed at a front side of the resin layer and a metal layer formed at a rear side of the resin layer,
wherein the top panel further includes an insulating layer formed on the resin layer so as to cover the metal layer formed at the front side of the resin layer and an insulating layer formed on the resin layer so as to cover the metal layer formed at the rear side of the resin layer, and
wherein warp which is caused to occur in the top panel under temperature change due to difference in coefficient of thermal expansion between the resin layer and the metal layer formed at the front side of the resin layer is cancelled by warp which is caused to occur in the top panel under temperature change due to difference in coefficient of thermal expansion between the resin layer and the metal layer formed at the rear side of the resin layer.

2. The semiconductor module according to claim 1, wherein the metal layer at the front side of the resin layer and the metal layer at the rear side of the resin layer are formed of a same material to have a same thickness.

3. The semiconductor module according to claim 2, wherein the metal layer at the front side of the resin layer and the metal layer at the rear side of the resin layer are each divided into a plurality of metal parts arranged in a regular pattern.

4. The semiconductor module according to claim 3, wherein, the metal parts of the metal layer at the front side of the resin layer and the metal parts of the metal layer at the rear side of the resin layer are arranged at equal pitches.

5. The semiconductor module according to claim 4, wherein each one of the metal parts of the metal layer at the front side of the resin layer is displaced with respect to each one of the metal parts of the metal layer at the rear side of the resin layer in both of two arrangement directions which are perpendicular to each other.

6. The semiconductor module according to claim 5, wherein a sum of areas occupied by the metal parts in the front side of the resin layer is equal to a sum of areas occupied by the metal parts in the rear side of the resin layer.

7. The semiconductor module according to claim 3, wherein the resin layer is formed of a transparent or translucent resin
and
wherein the metal layer at the front side of the resin layer and the insulating layer covering the metal layer are formed except an area of the front side of the resin layer corresponding to part of the metal layer at the rear side of the resin layer.

8. The semiconductor module according to claim 1, wherein the top panel is adhered, with adhesive, to one of a plurality of electronic components formed as the electronic component and placed on the module board.

9. The semiconductor module according to claim 1, wherein a surface of the top panel that is in contact with the adhesive is an uneven surface.

10. The semiconductor module according to claim 1, wherein the top panel has at least one opening into which one of a plurality of electronic components formed as the electronic component and placed on the module board is fitted.

11. The semiconductor module according to claim 1, wherein the resin layer of the top panel is formed of an organic material having thermal resistance sufficient to withstand heat from a reflow soldering process.

* * * * *